US008723620B2

(12) United States Patent  (10) Patent No.: US 8,723,620 B2
Nishimura et al.  (45) Date of Patent: May 13, 2014

(54) ANTENNA SHARER WITH A LADDER FILTER

(75) Inventors: Kazunori Nishimura, Kyoto (JP); Toru Jibu, Osaka (JP); Tetsuya Tsurunari, Osaka (JP)

(73) Assignee: Panasonic Corporation, Osaka (JP)

( * ) Notice: Subject to any disclaimer, the term of this patent is extended or adjusted under 35 U.S.C. 154(b) by 264 days.

(21) Appl. No.: 13/265,338

(22) PCT Filed: Apr. 21, 2010

(86) PCT No.: PCT/JP2010/002862
§ 371 (c)(1),
(2), (4) Date: Oct. 20, 2011

(87) PCT Pub. No.: WO2010/122786
PCT Pub. Date: Oct. 28, 2010

(65) Prior Publication Data
US 2012/0032753 A1 Feb. 9, 2012

(30) Foreign Application Priority Data

Apr. 23, 2009 (JP) ................. 2009-104969

(51) Int. Cl.
*H03H 9/00* (2006.01)
*H01P 5/12* (2006.01)
(52) U.S. Cl.
USPC .......................... 333/133; 333/126; 333/129
(58) Field of Classification Search
USPC .................. 333/126–129, 132, 133
See application file for complete search history.

(56) References Cited

U.S. PATENT DOCUMENTS

| | | | |
|---|---|---|---|
| 5,654,680 A | 8/1997 | Kwan et al. | |
| 6,246,302 B1 | 6/2001 | Muller et al. | |
| 6,501,208 B1 | 12/2002 | Kuroda | |
| 6,894,588 B2 | 5/2005 | Detlefsen | |
| 7,646,266 B2* | 1/2010 | Igaki et al. | 333/195 |
| 8,242,861 B2* | 8/2012 | Yata | 333/193 |
| 2004/0027213 A1 | 2/2004 | Takata | |
| 2004/0113720 A1* | 6/2004 | Komuro et al. | 333/133 |

(Continued)

FOREIGN PATENT DOCUMENTS

| | | |
|---|---|---|
| CN | 1264506 A | 8/2000 |
| CN | 1534870 A | 10/2004 |

(Continued)

OTHER PUBLICATIONS

International Search Report for Application No. PCT/JP2010/002862, Aug. 3, 2010, Panasonic Corporation.

(Continued)

*Primary Examiner* — Robert Pascal
*Assistant Examiner* — Kimberly Glenn
(74) *Attorney, Agent, or Firm* — RatnerPrestia

(57) ABSTRACT

An antenna sharer with both low loss and sharp attenuation characteristic in a wide band is achieved. Antennal sharer 1 of the present invention includes first filter 3 for passing a signal in the first frequency band, and second filter 4 for passing a signal in the second frequency band higher than the first frequency band. First filter 3 includes a ladder filter that includes first series resonator 6 and second series resonator 7 with an antiresonant frequency point higher than antiresonant frequency of first series resonator. Electromechanical coupling coefficient of first series resonator 6 is smaller than electromechanical coupling coefficient of second series resonator 7.

13 Claims, 14 Drawing Sheets

(56) References Cited

U.S. PATENT DOCUMENTS

| | | |
|---|---|---|
| 2004/0140866 A1 | 7/2004 | Taniguchi |
| 2004/0212450 A1 | 10/2004 | Nakamura et al. |
| 2006/0186968 A1* | 8/2006 | Ito .................................. 333/133 |
| 2008/0018417 A1 | 1/2008 | Igaki et al. |
| 2008/0150652 A1 | 6/2008 | Itou |
| 2008/0309193 A1* | 12/2008 | Ellesgaard et al. ...... 310/316.02 |
| 2009/0121810 A1 | 5/2009 | Fujii |
| 2009/0295507 A1* | 12/2009 | Kando et al. .................. 333/193 |
| 2010/0207707 A1 | 8/2010 | Yata |

FOREIGN PATENT DOCUMENTS

| | | |
|---|---|---|
| CN | 101212211 A | 7/2008 |
| JP | 58-223912 A | 12/1983 |
| JP | 62-199111 A | 9/1987 |
| JP | 09-167937 A | 6/1997 |
| JP | 09-214285 A | 8/1997 |
| JP | 11-88112 A | 3/1999 |
| JP | 2001-500697 A | 1/2001 |
| JP | 2001-358555 A | 12/2001 |
| JP | 2004-023611 A | 1/2004 |
| JP | 2004-242281 A | 8/2004 |
| WO | WO 2005/107069 A1 | 11/2005 |
| WO | WO 2005107069 A1 * | 11/2005 |
| WO | WO 2008/038481 A1 | 4/2008 |
| WO | WO 2009/119007 A1 | 10/2009 |
| WO | WO 2009119007 A1 * | 10/2009 |

OTHER PUBLICATIONS

State Intellectual Property Office of People's Republic of China Search Report for Application No. 201080017534.5 dated Nov. 20, 2013.

* cited by examiner

ANTENNA SHARER WITH A LADDER FILTER

THIS APPLICATION IS A U.S. NATIONAL PHASE APPLICATION OF PCT INTERNATIONAL APPLICATION PCT/JP2010/002862.

TECHNICAL FIELD

The present invention relates to antenna sharers with transmission filter and reception filter.

BACKGROUND ART

In line with the recent rapid spreading of mobile phones adopting a communication system that allows simultaneous transmission and reception, such as CDMA and W-CDMA, demands for antenna sharers are increasing. Technology for configuring antenna sharers mainly employs SAW (Surface Acoustic Wave) element, Boundary Elastic Wave element, or BAW (Bulk Acoustic Wave) element, taking into account their small and short size and advantage for mass production.

In general, an antenna sharer have two filters (transmission filter and reception filter) for separating signals in transmission band and signals in reception band, which is a higher band adjacent to the transmission band. In particular, a ladder filter, in which series resonators and parallel resonators are connected in a ladder structure, is adopted as the transmission filter.

For example, Band 8 specified by 3GPP ($3^{RD}$ Generation Partnership Project) has a distance (crossband) of 10 MHz between the transmission band and reception band (1.09% if expressed by fractional bandwidth). This is extremely narrow compared to Band 5 that is often used in conventional antenna sharers. The distance between the transmission band and reception band in Band 5 is 20 MHz (fractional bandwidth: 2.33%). One known technology for securing sharpness corresponding to this narrow crossband is to weight IDT (Inter Digital Transducer) of the resonator in the transmission filter.

A prior art related to the present invention is, for example, PTL 1. However, PTL 1 aims to achieve narrow band, and thus no method for realizing an antenna sharer for wide band such as Band 8, whose band width is 35 MHz (fractional bandwidth: 3.9%), is disclosed.

In addition to Band 8, Band 3 is also a wide band, and thus antenna sharers that satisfy both low loss and sharp attenuation characteristic will be needed.

However, the known prior art fails to achieve sufficient sharpness if low loss is also achieved in the wide band. In addition, in a transmission filter of the conventional antenna sharer in the above PTL 1, if sharpness is increased to secure sufficient attenuation in the reception band, the transmission band width is narrowed. On the contrary, this increases losses in the wide transmission passband. In particular, in the transmission and reception passband of the above band 8, a fractional bandwidth is as wide as 3.9%. Accordingly, it is extremely difficult to retain a small loss over the wide transmission passband.

CITATION LIST

Patent Literature

[PTL 1] Japanese Translation of PCT Publication No. 2001-500697

SUMMARY OF THE INVENTION

The present invention aims to achieve both sharpness in crossband and low loss in transmission passband in a transmission filter of an antenna sharer.

The antenna sharer of the present invention includes a first filter for passing a signal in a first frequency band, and a second filter for passing a signal in a second frequency band higher than the first frequency band. The first filter has a ladder filter including a first series resonator and a second series resonator with antiresonant frequency point higher than antiresonant frequency of the first series resonator. Electromechanical coupling coefficient of the first series resonator is smaller than electromechanical coupling coefficient of the second series resonator.

In the above configuration, sharpness in crossband can be improved by setting a small low electromechanical coupling coefficient for the first series resonator whose antiresonant frequency that has large influence on sharpness is relatively low. In addition, a passband width can be broadened by securing a large electromechanical coupling coefficient for the second series resonator whose antiresonant frequency that has small influence on sharpness is relatively high. This suppresses loss in a wide transmission passband. In other words, the antenna sharer of the present invention can achieve both sharpness in crossband and low loss in transmission passband.

BRIEF DESCRIPTION OF DRAWINGS

FIG. 1 is a circuit diagram of an antenna sharer in accordance with a first exemplary embodiment of the present invention.

FIG. 2 illustrates frequency characteristics of the antenna sharer in accordance with the first exemplary embodiment of the present invention.

FIG. 3 illustrates a configuration of resonator to which a means for reducing electromechanical coupling coefficient is provided in the antenna sharer in accordance with the first exemplary embodiment of the present invention.

FIG. 4 illustrates a configuration of resonator to which the means for reducing electromechanical coupling coefficient is not provided in the antenna sharer in accordance with the first exemplary embodiment of the present invention.

FIG. 5 illustrates a configuration of resonator to which a means for reducing electromechanical coupling coefficient is provided in the antenna sharer in accordance with a second exemplary embodiment of the present invention.

FIG. 6 illustrates a configuration of resonator to which a means for reducing electromechanical coupling coefficient is provided in the antenna sharer in accordance with a third exemplary embodiment of the present invention.

FIG. 7 illustrates a configuration of resonator to which a means for reducing electromechanical coupling coefficient is provided in the antenna sharer in accordance with a fourth exemplary embodiment of the present invention.

FIG. 8 illustrates a configuration of resonator to which a means for reducing electromechanical coupling coefficient is provided in the antenna sharer in accordance with a fifth exemplary embodiment of the present invention.

FIG. 9 illustrates a configuration of resonator to which a means for reducing electromechanical coupling coefficient is provided in the antenna sharer in accordance with a sixth exemplary embodiment of the present invention.

FIG. 10 illustrates a configuration of resonator to which a means for reducing electromechanical coupling coefficient is provided in the antenna sharer in accordance with a seventh exemplary embodiment of the present invention.

Figure 14:
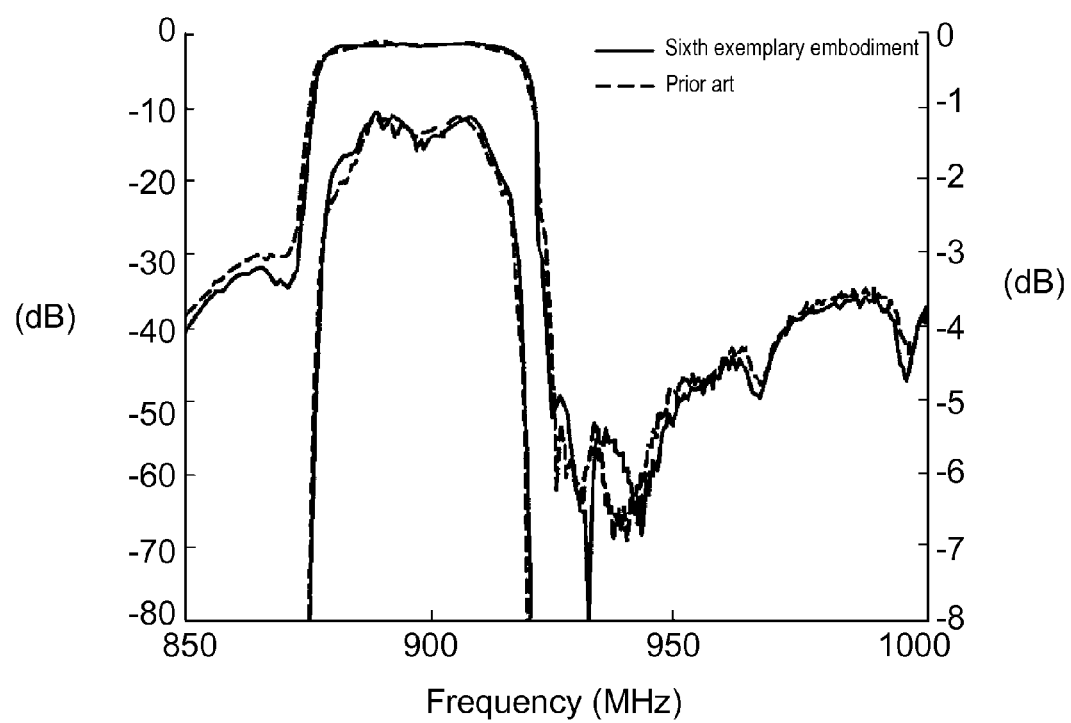

FIG. 14 compares characteristics of the present invention and that of a prior art.

DETAILED DESCRIPTION OF PREFERRED EMBODIMENTS (First Exemplary Embodiment)

Figure 1:
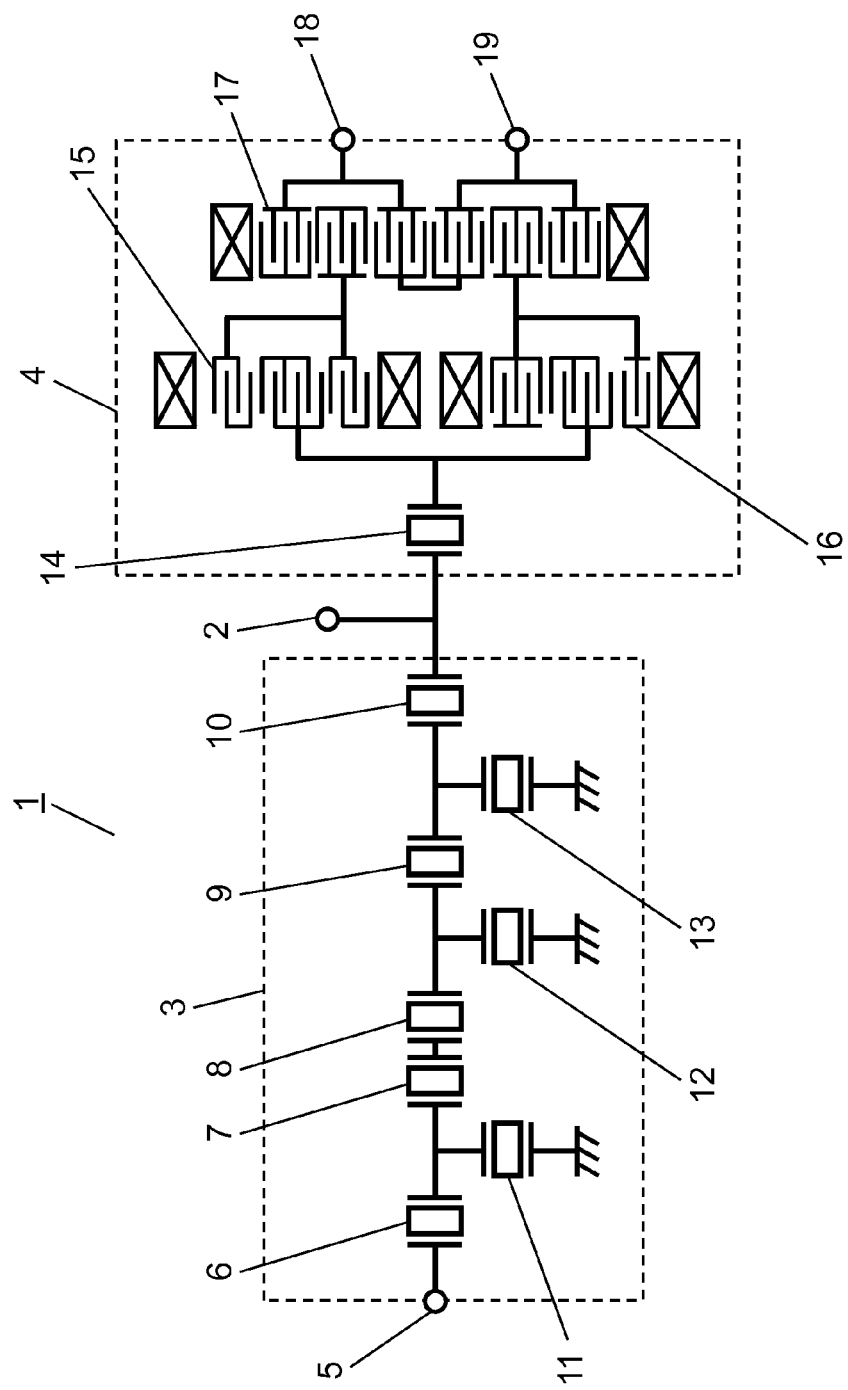

The first exemplary embodiment is described below with reference to drawings. FIG. 1 is a circuit diagram of an antenna sharer for Band 8 in the first exemplary embodiment.

In FIG. 1, antenna sharer 1 is a sharer formed typically on a lithium tantalate piezoelectric substrate (not illustrated), and includes first filter 3 that is a transmission filter, and second filter 4 that is a reception filter. Both filters are connected to antenna terminal 2, respectively.

For example, in above antenna sharer 1 for Band 8, first filter 3 passes signals in a first frequency band that is a transmission band between 880 MHz and 915 MHz. Second filter 4 passes signals in a second frequency band that is a reception band between 925 MHz and 960 MHz higher than the first frequency band.

First filter 3 and second filter 4 are detailed below. First filter 3 is a ladder filter, and includes input terminal 5, and first series resonator 6, second series resonator 7, third series resonator 8, fourth series resonator 9, and fifth series resonator 10 that are connected in series in this sequence from input terminal 5 to antenna terminal 2. First filter 3 also includes first parallel resonator 11 grounded in parallel between first series resonator 6 and second series resonator 7, second parallel resonator 12 grounded in parallel between third series resonator 8 and fourth series resonator 9, and third parallel resonator 9 ground in parallel between fourth series resonator 9 and fifth series resonator 10. Table 1 shows resonance frequency, antiresonant frequency, static capacitance, and electromechanical coupling coefficient of the resonators configuring first filter 3 in the first exemplary embodiment of the present invention.

TABLE 1

|  | Resonance frequency [MHz] | Antiresonant frequency [MHz] | Static capacitance [pF] | Electromechanical coupling coefficient [%] |
|---|---|---|---|---|
| First series resonator 6 | 894 | 923 | 7.8 | 7.9 |
| First parallel resonator 11 | 864 | 897 | 4.7 | 8.6 |
| Second series resonator 7 | 899 | 932 | 3.4 | 8.2 |
| Third series resonator 8 | 900 | 932 | 3.1 | 8.3 |

TABLE 1-continued

|  | Resonance frequency [MHz] | Antiresonant frequency [MHz] | Static capacitance [pF] | Electromechanical coupling coefficient [%] |
|---|---|---|---|---|
| Second parallel resonator 12 | 871 | 902 | 3.6 | 8.3 |
| Fourth series resonator 9 | 910 | 943 | 2.2 | 8.0 |
| Third parallel resonator 13 | 867 | 890 | 3.3 | 8.6 |
| Fifth series resonator 10 | 899 | 932 | 2.6 | 8.0 |

The electromechanical coupling coefficients in Table 1 are calculated based on the following formula (Formula 1) using resonance frequency and antiresonant frequency of each resonator.

$$k^2 = \frac{\pi}{2} \cdot \frac{f_s}{f_a} \cdot \tan\left(\frac{\pi}{2} \frac{\Delta f}{f_a}\right) \quad \text{[Formula 1]}$$

Second filter 4 includes sixth series resonator 14 connected to antenna terminal 2, first duplex mode elastic wave filter 15, second duplex mode elastic wave filter 16, and third duplex mode elastic wave filter 17. First duplex mode elastic wave filter 15 and second duplex mode elastic wave filter 16 are branched from sixth series resonator 14 and connected. Third duplex mode elastic wave filter 17 is connected to first duplex mode elastic wave filter 15 and second duplex mode elastic wave filter 1, respectively. In addition, second filter 4 includes output terminals 18 and 19 connected to third duplex mode elastic wave filter 17. A reception signal is output in balance from these output terminals 18 and 19. Same as first filter 3, second filter 4 may be configured with a ladder filter.

Figure 2:
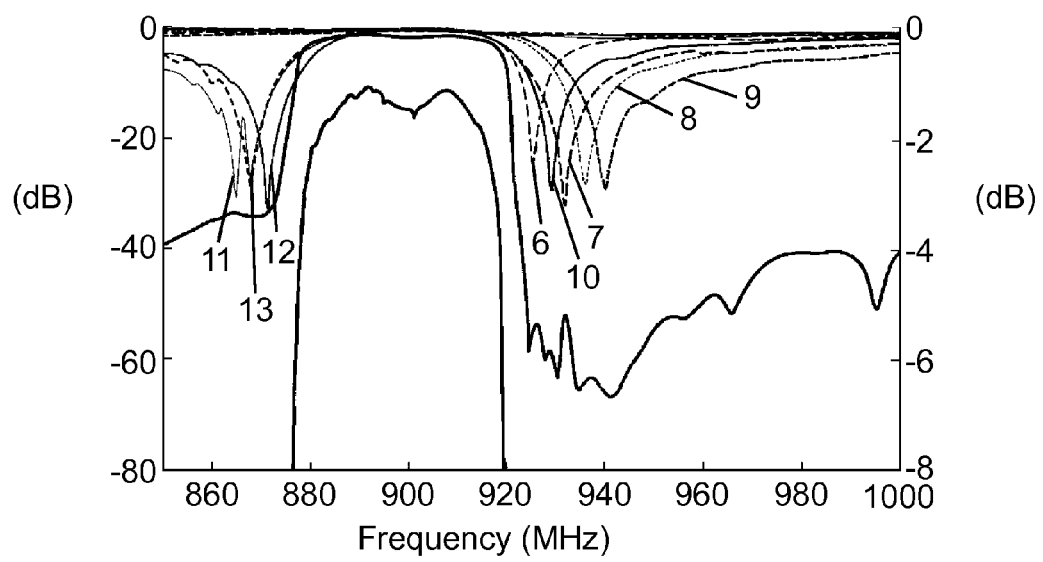

FIG. 2 shows frequency characteristics of each of series resonators 6, 7, 8, 9, and 10, and parallel resonators 11, 12, and 13 of first filter 3. Numbers in FIG. 2 show reference marks of resonators, respectively.

As shown in FIG. 2, antiresonant frequency of second series resonator 7 is higher than antiresonant frequency of first series resonator 6. Antiresonant frequencies of other series resonators 8, 9, and 10 are also higher than antiresonant frequency of first series resonator 6.

The electromechanical coupling coefficient of first series resonator 6 is reduced by providing a means for reducing electromechanical coupling coefficient to first series resonator 6. The means for reducing electromechanical coupling coefficient is detailed later. On the other hand, the means for reducing electromechanical coupling coefficient is not provided to other series resonators including second series resonator 7.

As described above, in first filter 3 of antenna sharer 1, the sharpness in crossband can be improved by achieving a small electromechanical coupling coefficient for first series resonator 6 whose antiresonant frequency that has a large influence on sharpness is relatively low. In addition, a passband width is broadened by securing a large electromechanical coupling coefficient for other series resonators including second series resonator 7 whose antiresonant frequency that has a small influence on sharpness is relatively high. This suppresses losses in a wide transmission passband. In other words, antenna sharer 1 of the present invention can achieve sharpness in crossband and low loss in the transmission passband.

Capacity ratio of first series resonator 6 that has relatively small electromechanical coupling coefficient becomes relatively large. Therefore, as shown in FIG. 1, power durability of first filter 3 against a transmission signal amplified such as by a power amplifier can be improved by connecting first series resonator 6 to the outermost arm to the side of input terminal 5 in first filter 3.

Figure 3:
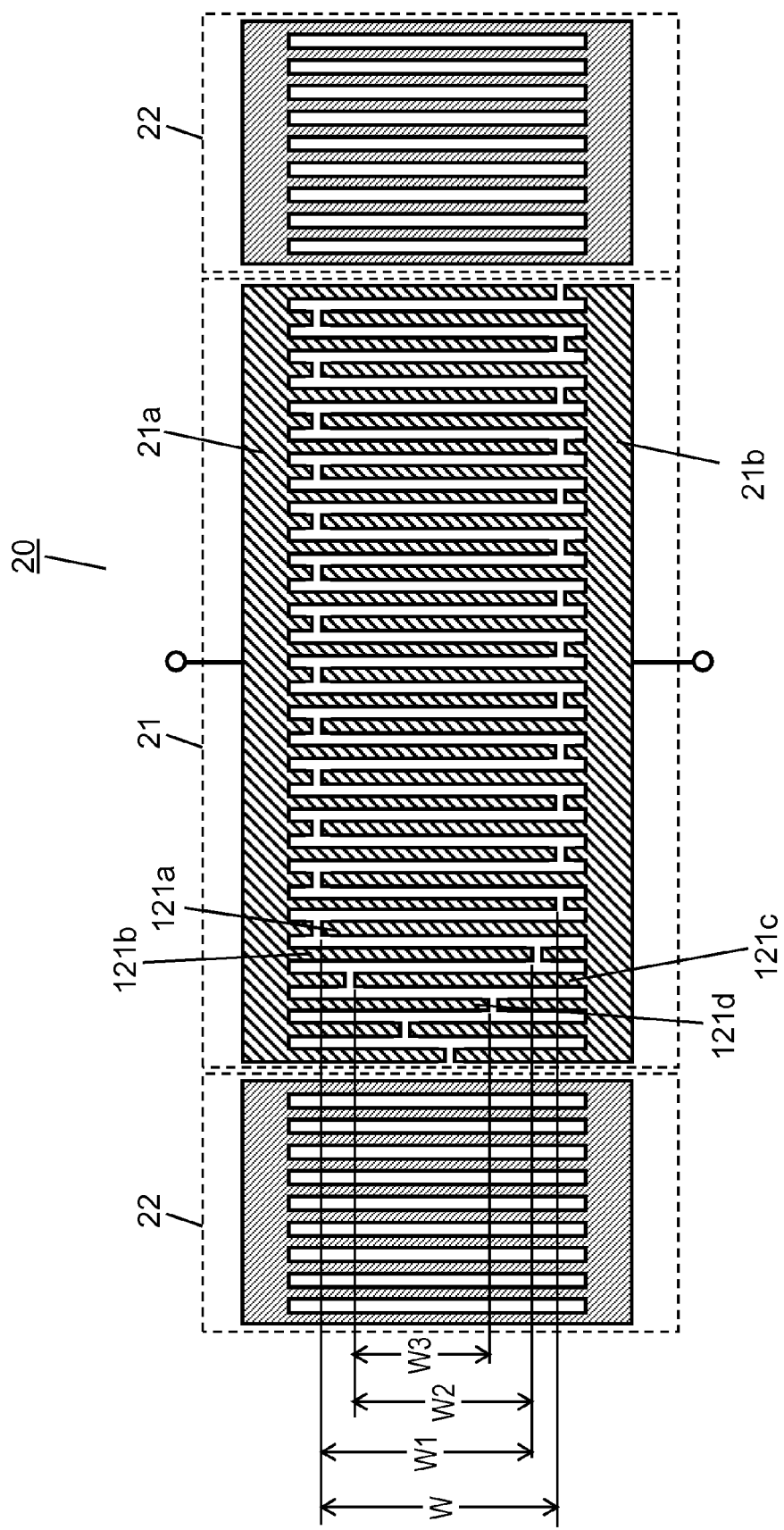

Next, the means for reducing electromechanical coupling coefficient is detailed with reference to drawings. FIG. 3 shows an example of the means for reducing electromechanical coupling coefficient of the present invention. As shown in FIG. 3, resonator 20, to which the means for reducing electromechanical coupling coefficient is provided, is sandwiched between reflectors 22, and has apodization-weighted IDT 21 so that its crossover width becomes smaller in a phased manner from the center toward ends of resonator 20. IDT 21 is configured with comb electrode 21a and comb electrode 21b. The crossover width is a width that an electrode finger of comb electrode 21a and an electrode finger of comb electrode 21b adjacent to each other overlap. In FIG. 3, W is the crossover width. A crossover width of electrode finger 121a and electrode finger 121b is W1, and a crossover width of electrode finger 121b and electrode finger 121c is W2. A crossover width of electrode finger 121c and electrode finger 121d is W3. The crossover width becomes smaller from the center toward the ends (the left end in the drawing). This configuration enables reduction of only antiresonant frequency almost without changing resonance frequency. Consequently, a resonator with small electromechanical coupling coefficient can be achieved.

Figure 4:
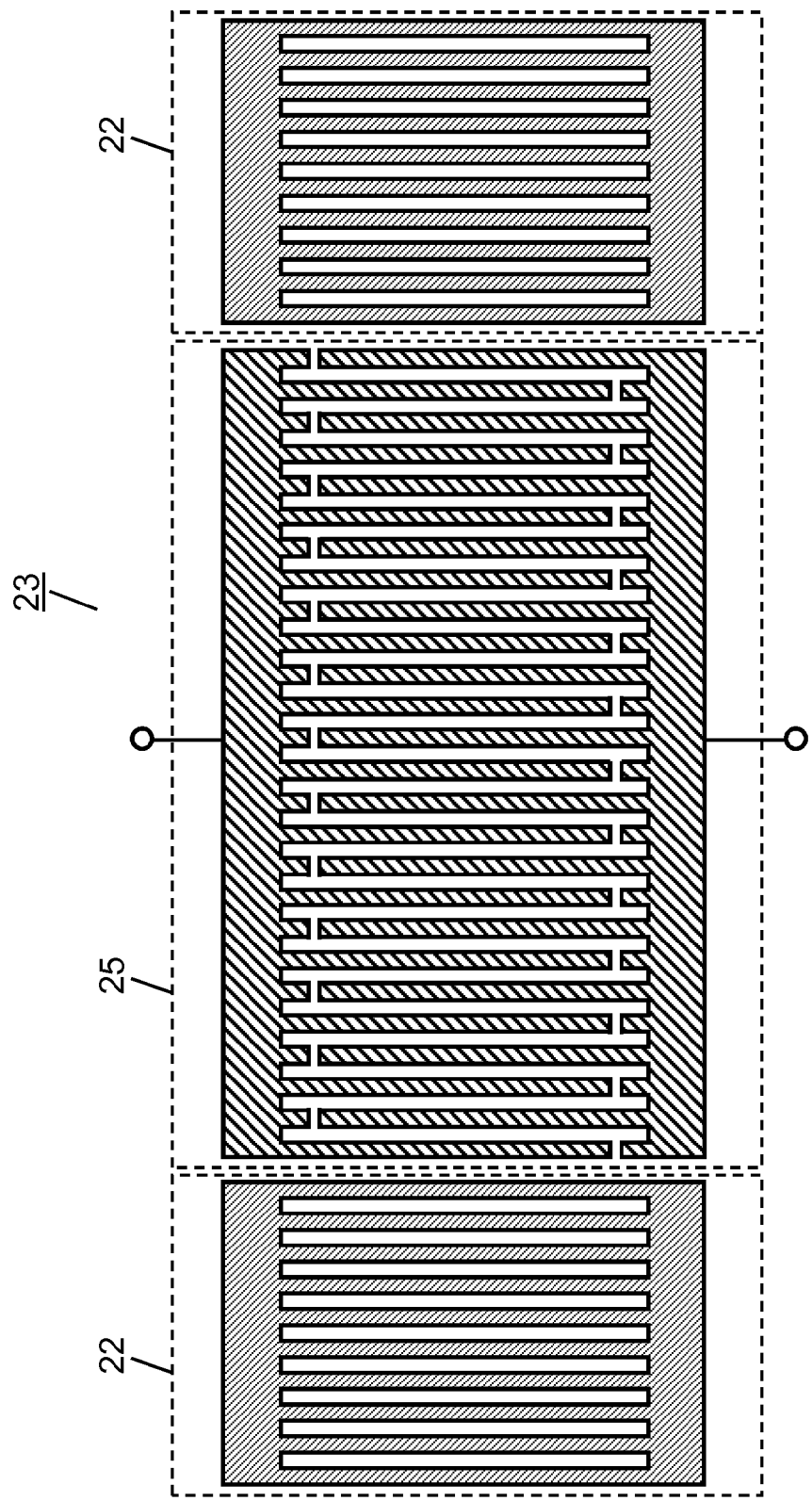

FIG. 4 shows resonator 23 without the means for reducing electromechanical coupling coefficient. IDT 25 sandwiched between reflectors 22 has normal comb electrodes whose crossover widths are substantially uniform.

FIG. 4 shows a configuration of resonator without the means for reducing electromechanical coupling coefficient in the antenna sharer in the first exemplary embodiment of the present invention. Resonator 23 in FIG. 4 has 180 electrode fingers in IDT 25, a crossover width of 160 μm, metallization ratio (electrode finger width/electrode pitch) of 0.58, and 25 electrode fingers for reflector 22. The electromechanical coupling coefficient of resonator 23 as configured above is 8.35%. On the other hand, resonator 20 with the means for reducing electromechanical coupling coefficient, as shown in FIG. 3, has 180 electrode fingers for IDT 21, metallization ratio (electrode finger width/electrode pitch) of 0.58, and 25 electrode fingers for reflector 22. They are the same as that of resonator 23. However, a crossover width of IDT 21 is 190 μm and weight is given to this crossover width in an arccosine manner in a 20% area from one end of IDT 21. These points differ from resonator 23. By providing the means for reducing electromechanical coupling coefficient, static capacitance equivalent to that of resonator 23 shown in FIG. 4 is achieved. The electromechanical coupling coefficient can be made as small as 8.11%, and Q value has also improved by about 8%.

In first filter 3 of antenna sharer 1, both sharpness in crossband and low loss in the transmission passband are achieved by providing the aforementioned means for reducing electromechanical coupling coefficient to a series resonator with relatively low antiresonant frequency, and not providing the aforementioned means for reducing electromechanical coupling coefficient to a series resonator with relatively high antiresonant frequency.

Furthermore, the antenna sharer can further improve sharpness in crossband and further reduce loss in the transmission passband by providing the aforementioned means for reducing electromechanical coupling coefficient to first series resonator 6 with the lowest antiresonant frequency and not providing it to other series resonators and parallel resonators in first filter 3.

(Second Exemplary Embodiment)

Figure 5:
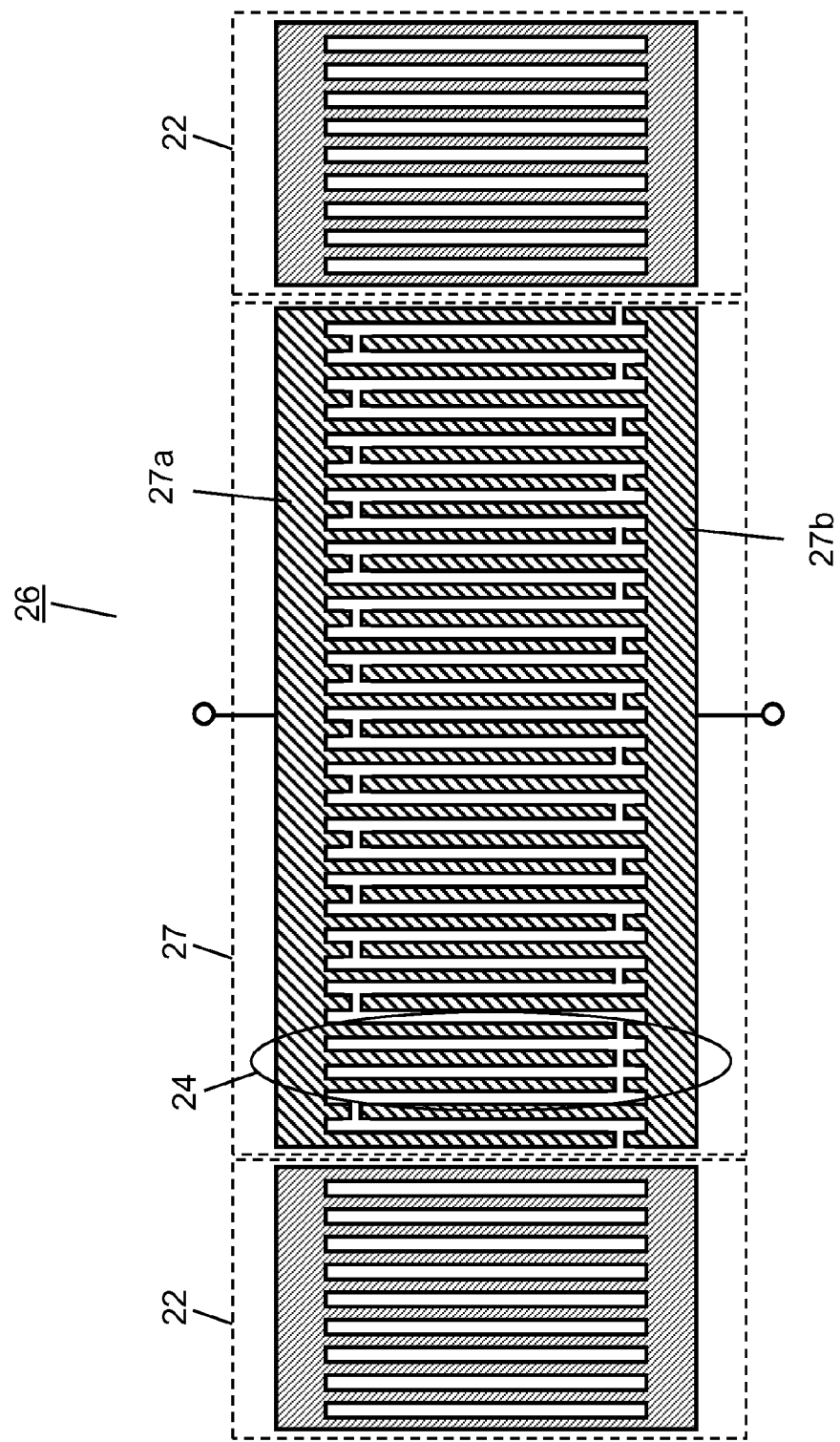

An antenna sharer in the second exemplary embodiment of the present invention is described below with reference to drawings. FIG. 5 shows resonator 26 with a means for reducing electromechanical coupling coefficient in the antenna sharer in the second exemplary embodiment of the present invention. Unless particularly described, a configuration of the antenna sharer in the second exemplary embodiment is the same as that of the first exemplary embodiment, and thus the same reference marks are given.

Resonator 26 has IDT 27 with thinned-out weight 24 to partially eliminate crossover between I/O electrode fingers of comb electrode 27a and comb electrode 27b. This configuration enables reduction of only antiresonant frequency almost without changing resonance frequency. Consequently, a resonator with small electromechanical coupling coefficient can be achieved.

Resonator 26 with the means for reducing electromechanical coupling coefficient shown in FIG. 5 has 180 electrode fingers for IDT 27, metallization ratio (electrode finger width/electrode pitch) of 0.58, and 25 electrode fingers for reflector 22. They are the same as that of resonator 23 shown in FIG. 4. However, a crossover width of IDT 27 is 170 μm, and four electrode fingers of IDT 27 are inverted at four points to give a thinned-out weight for creating portions without crossover. These points differ from resonator 23. By providing the means for reducing electromechanical coupling coefficient in this way, resonator 26 achieves the static capacitance equivalent to that of resonator 23 shown in FIG. 4. The electromechanical coupling coefficient can be made as small as 8.15%, and Q value also improves by about 2%.

In first filter 3, both sharpness in crossband and low loss in the transmission passband are achieved by providing the aforementioned means for reducing electromechanical coupling coefficient to a series resonator with relatively low antiresonant frequency, and not providing the aforementioned means for reducing electromechanical coupling coefficient to a series resonator with relatively high antiresonant frequency.

Furthermore, the antenna sharer can further improve sharpness in crossband and also further reduce losses in the transmission passband by providing the aforementioned means for reducing electromechanical coupling coefficient to first series resonator 6 with the lowest antiresonant frequency, and not providing it to other series resonators and parallel resonators in first filter 3.

(Third Exemplary Embodiment)

Figure 6:
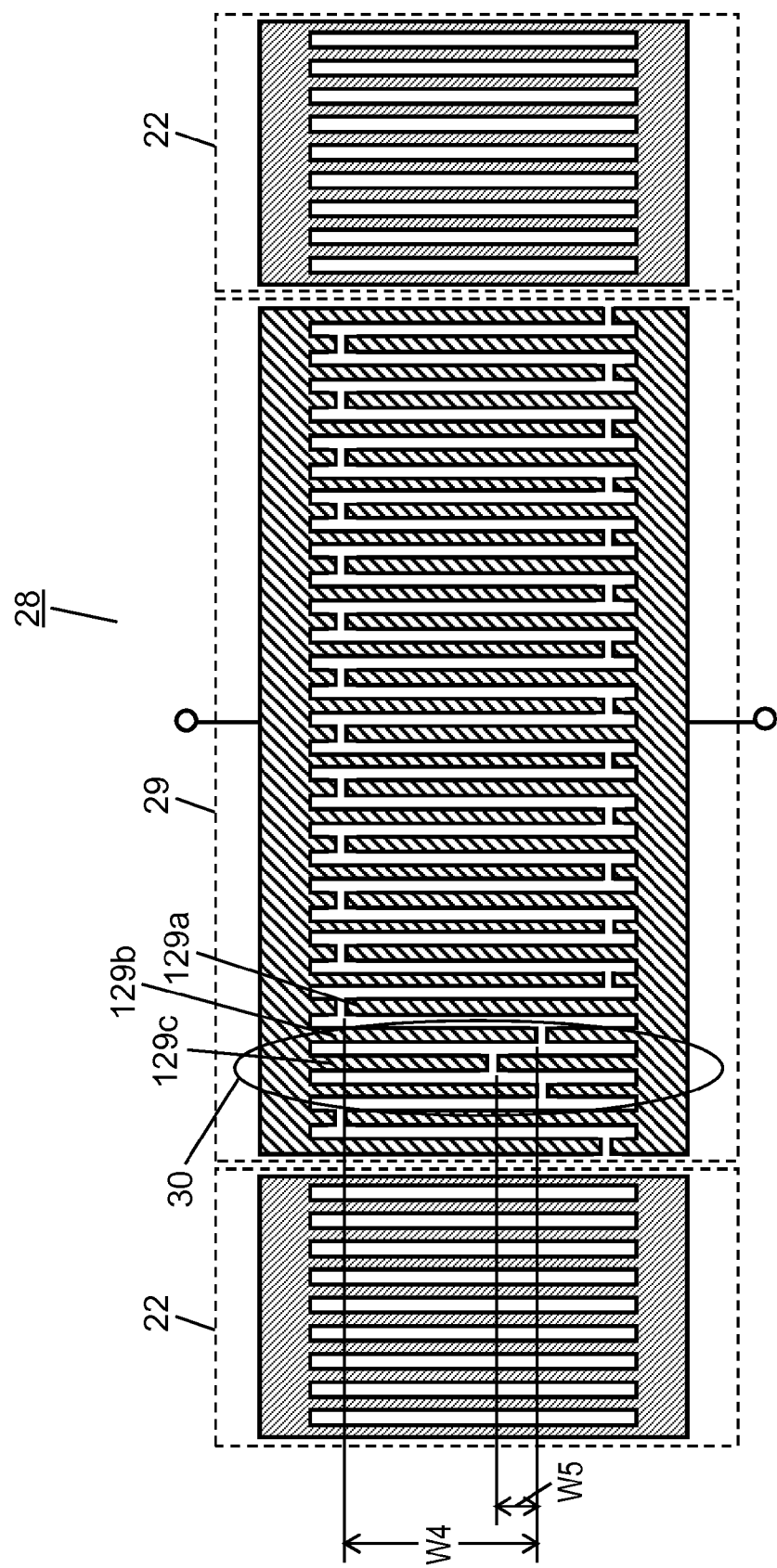

An antenna sharer in the third exemplary embodiment is described below with reference to drawings. FIG. 6 is resonator 28 with a means for reducing electromechanical coupling coefficient in the antenna sharer in the third exemplary embodiment. Unless particularly described, a configuration of the antenna sharer in the third exemplary embodiment is the same as that of antenna sharer in other exemplary embodiments, and thus same reference marks are given.

Resonator 28 has IDT 29 with weight 30 in which a part of its crossover width is smaller than other part. For example, in FIG. 6, crossover width W4 of electrode finger 129a and electrode finger 129b and crossover width W5 of electrode finger 129b and electrode finger 129c are smaller than crossover width W of other part. This configuration enables reduction of only antiresonant frequency almost without changing resonance frequency. Consequently, a resonator with small electromechanical coupling coefficient can be achieved.

Resonator 28 with means for reducing electromechanical coupling coefficient shown in FIG. 6 has 180 electrode fingers for IDT 29, metallization ratio (electrode finger width/electrode pitch) of 0.58, and 25 electrode fingers for reflector 22. These points are the same as that of resonator 23 shown in FIG. 4. However, the crossover width is 170 µm, and IDT 29 is weighted such that some of crossover widths of IDT 29 become 70% and 30% of the maximum crossover width. These points are different. By providing the means for reducing electromechanical coupling coefficient in this way, resonator 28 achieves the static capacitance equivalent to that of resonator 23 shown in FIG. 4. The electromechanical coupling coefficient can be made as small as 8.16%, and Q value also improves by about 2%.

In first filter 3, both sharpness in crossband and low loss in the transmission passband are achieved by providing the aforementioned means for reducing electromechanical coupling to a series resonator with relatively low antiresonant frequency, and not providing the aforementioned means for reducing electromechanical coupling to a series resonator with relatively high antiresonant frequency.

Furthermore, the antenna sharer can further improve sharpness in crossband and further reduce loss in the transmission passband by providing the aforementioned means for reducing electromechanical coupling coefficient to first series resonator 6 with the lowest antiresonant frequency and not providing it to other series resonators and parallel resonators in first filter 3.

(Fourth Exemplary Embodiment)

Figure 7:
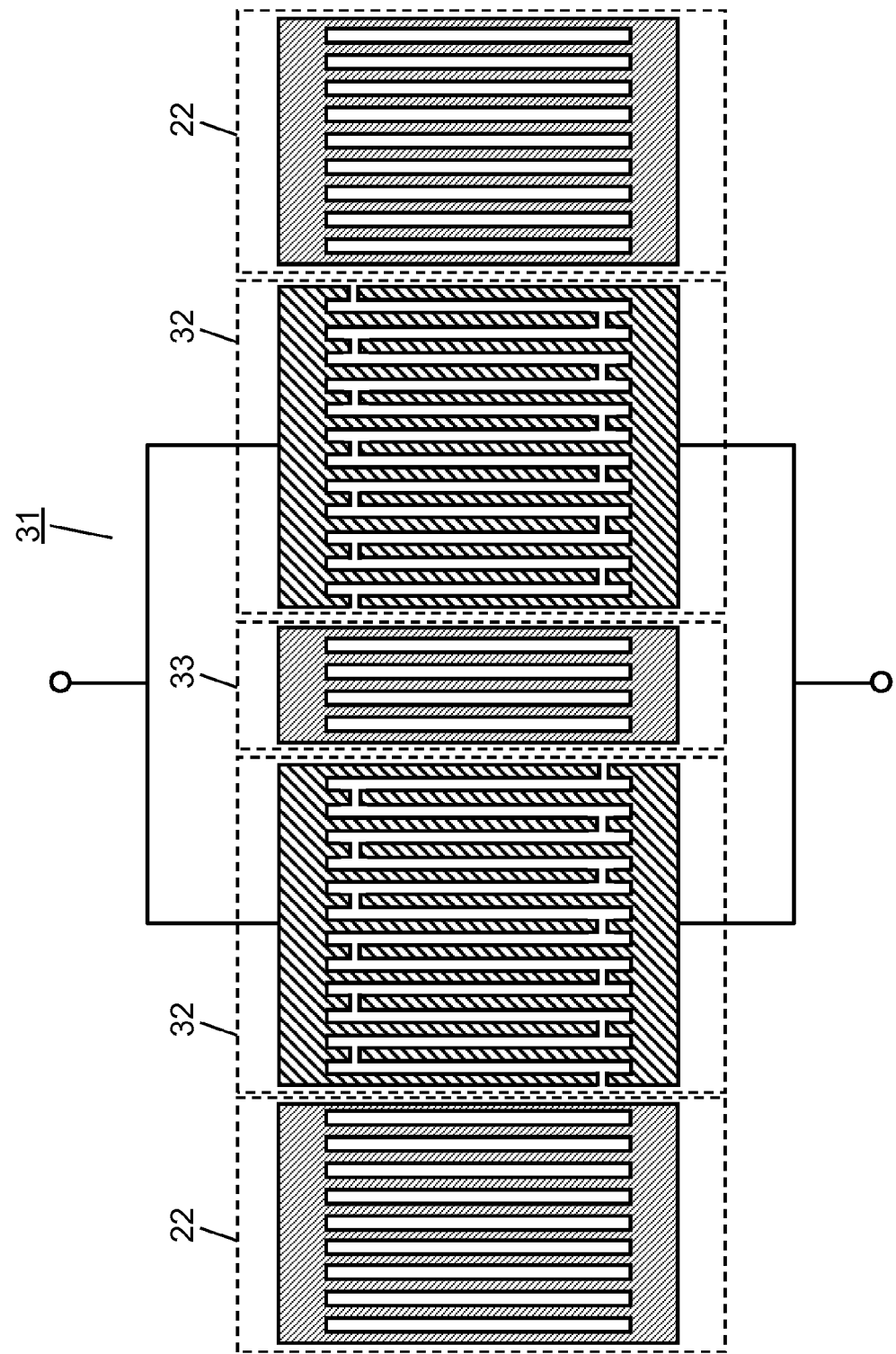

An antenna sharer in the fourth exemplary embodiment of the present invention is described below with reference to drawings. FIG. 7 shows resonator 31 with a means for reducing electromechanical coupling coefficient in the antenna sharer in the fourth exemplary embodiment. Unless particularly described, a configuration of antenna sharer in the fourth exemplary embodiment is the same as that of other exemplary embodiments, and thus same reference marks are given.

Resonator 31 has multiple IDTs 32 of normal comb electrodes connected in parallel to each other. Reflector 33 is formed between these multiple IDTs 32. Reflectors 22 are also formed at both ends of these multiple IDTs 32. This configuration enables reduction of antiresonant frequency almost without changing resonance frequency. Consequently, a resonator with small electromechanical coupling coefficient can be achieved.

Resonator 31 with the means for reducing electromechanical coupling coefficient shown in FIG. 7 has 90 electrode fingers each for IDTs 32 connected in parallel, 25 electrode fingers each for three reflectors 22 and 33, and a crossover width of 160 µm for IDTs 32. This achieves the static capacitance equivalent to that of resonator 23 shown in FIG. 4. The electromechanical coupling coefficient can be made as small as 8/11%, and Q value is also equivalent to that of resonator 23.

In first filter 3, both sharpness in crossband and low loss in the transmission passband are achieved by providing the aforementioned means for reducing electromechanical coefficient in a series resonator with relatively low antiresonant frequency, and not providing the aforementioned electromechanical coupling coefficient in a series resonator with relatively high antiresonant frequency.

Furthermore, the antenna sharer can further improve sharpness in crossband and also further reduce losses in the transmission passband by providing the aforementioned means for reducing electromechanical coupling coefficient to first series resonator 6 with the lowest antiresonant frequency and not providing it to other series resonators and parallel resonators in first filter 3.

(Fifth Exemplary Embodiment)

Figure 8:
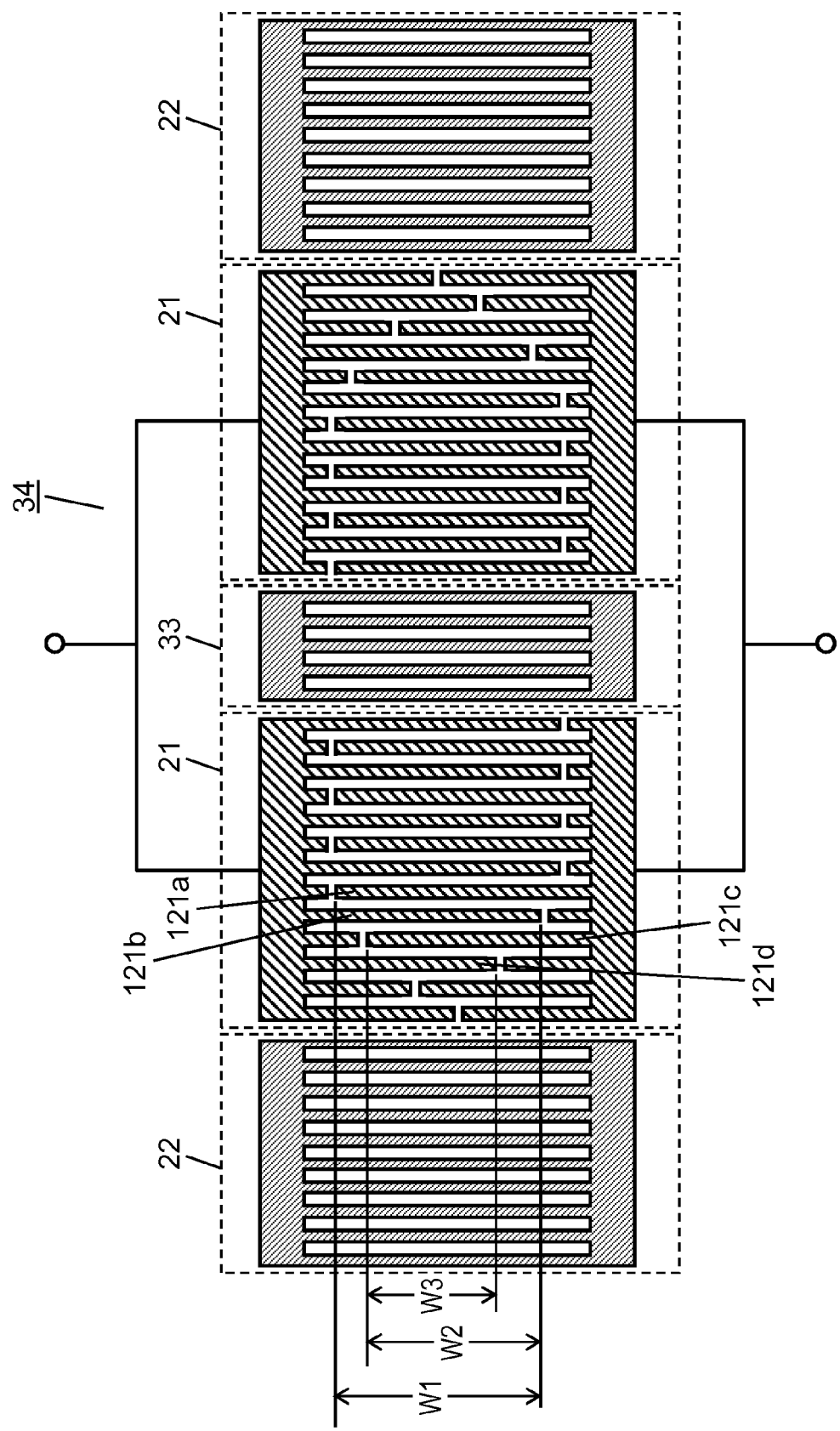

An antenna sharer in the fifth exemplary embodiment is described below with reference to drawings. FIG. 8 is resonator 34 with a means for reducing electromechanical coupling coefficient in the antenna sharer in the fifth exemplary embodiment. Unless particularly described, a configuration of the antenna sharer is the same as that of antenna sharers in other exemplary embodiments, and thus same reference marks are given.

Resonator 34 has apodization-weighted IDTs 21 in which its crossover width becomes smaller in a phased manner from the center toward an end. These IDTs 21 are connected in parallel to each other. As shown in FIG. 8, a crossover width of electrode finger 121a and electrode finger 121b in IDT 21 at one side (IDT to the left in FIG. 8) is W1, and a crossover width of electrode finger 121b and electrode finger 121c is W2, and a crossover width of electrode finger 121c and electrode finger 121d is W3. The crossover width becomes smaller from the center toward the end (left end in the drawing). Although not detailed here, IDT 21 at the other side also has the same configuration. The crossover width becomes smaller from the center to the end (right end in the drawing). Reflector 33 is formed between these IDTs 21. Reflectors 22 are also formed at both ends of IDTs 21.

Resonator 34 shown in FIG. 8 has 90 electrode fingers each for IDTs 21, 25 electrode fingers each for three reflectors 22 and 33, and a crossover width of 190 µm for IDT 21. The static capacitance equivalent to that of resonator 23 shown in FIG. 4 is achieved by weighting IDT 21 in an arccosine manner in a 20% area from one end of IDT 21. The electromechanical coupling coefficient can be made as small as 7.88%, and Q value is also about the same value. This configuration efficiently achieves a resonator with small electromechanical coupling coefficient.

In first filter 3, both sharpness in crossband and low loss in the transmission passband are achieved by providing the aforementioned means for reducing electromechanical coupling coefficient to a series resonator with relatively low antiresonant frequency, and not providing the aforementioned means for reducing electromechanical coupling coefficient to a series resonator with relatively high antiresonant frequency.

Furthermore, the antenna sharer can further improve sharpness in crossband and also further reduce losses in the transmission passband by providing the aforementioned means for reducing electromechanical coupling coefficient to first series resonator 6 with the lowest antiresonant frequency and not providing it to other series resonators and parallel resonators in first filter 3.

(Sixth Exemplary Embodiment)

Figure 9:
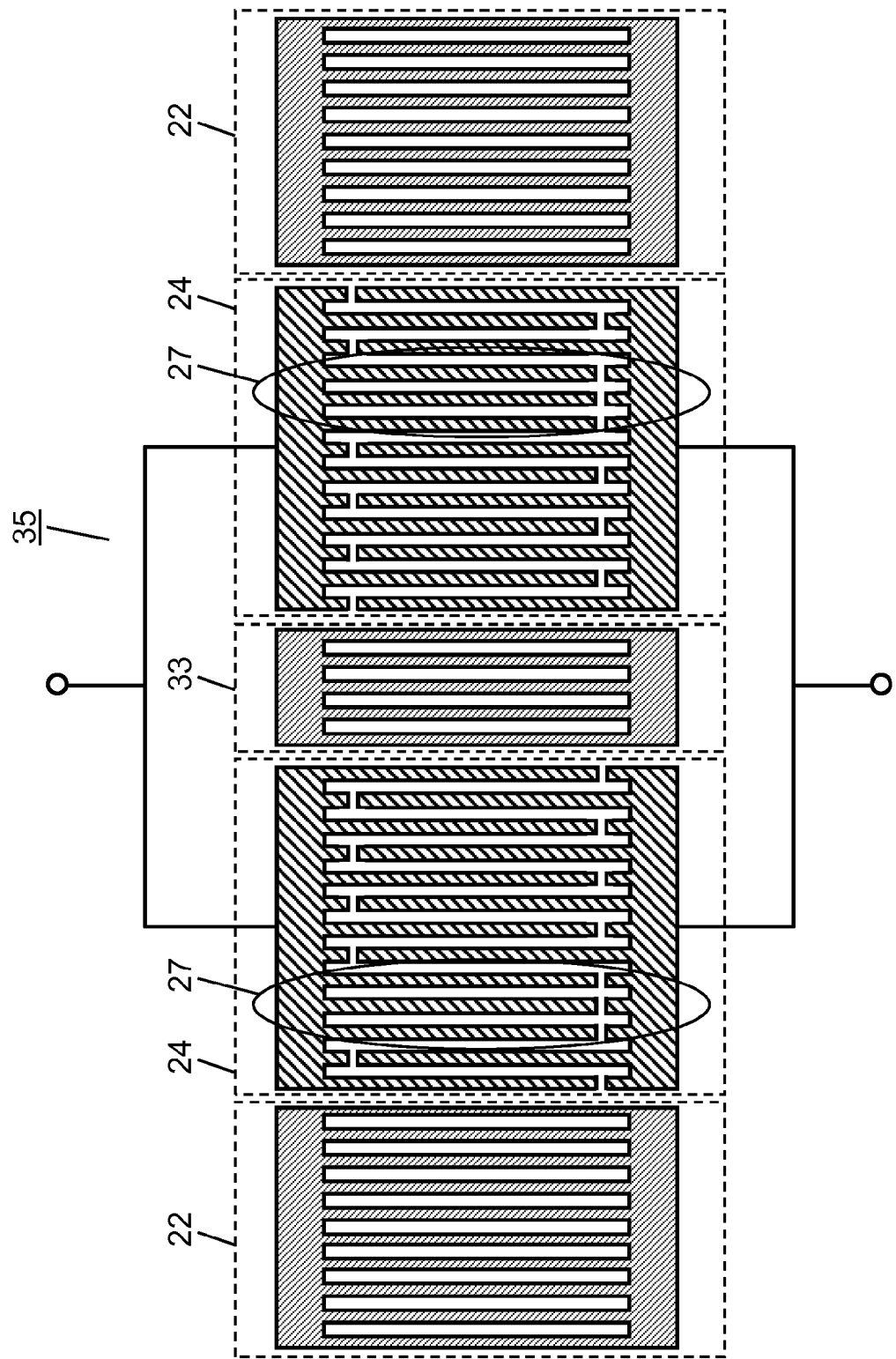

An antenna sharer in the sixth exemplary embodiment is described below with reference to drawings. FIG. 9 is resonator 35 with a means for reducing electromechanical coupling coefficient in the antenna sharer in the sixth exemplary embodiment. Unless particularly described, the configuration of the antenna sharer in the sixth exemplary embodiment is the same as that of the antenna sharers in other exemplary embodiments, and thus same reference marks are given.

Resonator 35 has IDTs 24 with thinned-out weight 27 to partially eliminate crossover of I/O electrode fingers. These IDTs 24 are connected in parallel to each other. Reflector 33 is also formed between these multiple IDTs 27.

Resonator 35 shown in FIG. 9 has 90 electrode fingers each for IDTs 24 connected in parallel, 25 electrode fingers each for three reflectors 22 and 33, and a crossover width of 170 μm for IDTs 24. This achieves the static capacitance equivalent to that of resonator 23 shown in FIG. 4. The electromechanical coupling coefficient can be made as small as 7.95%, and Q value is also about the same. This configuration efficiently achieves a resonator with small electromechanical coupling coefficient.

In first filter 3, both sharpness in crossband and low loss in the transmission passband are achieved by providing the aforementioned means for reducing electromechanical coefficient to a series resonator with relatively low antiresonant frequency, and not providing the aforementioned means for reducing electromechanical coupling coefficient to a series resonator with relatively high antiresonant frequency.

Furthermore, the antenna sharer can further improve sharpness in crossband and also further reduce losses in the transmission passband by providing the aforementioned means for reducing electromechanical coupling coefficient to first series resonator 6 with the lowest antiresonant frequency and not providing it to other series resonators and parallel resonators in first filter 3.

FIG. 14 shows comparison of characteristics of the transmission filter of the antenna sharer in the sixth exemplary embodiment and characteristics of the transmission filter of the conventional antenna sharer. More specifically, the antenna sharer in the sixth exemplary embodiment has the configuration employing first series resonator 6 with the means for reducing electromechanical coupling coefficient and also other resonators without the means for reducing electromechanical coupling coefficient. The conventional antenna sharer has the configuration employing all resonators without the means for reducing electromechanical coupling coefficient shown in FIG. 4. Insertion loss at 915 MHz is 2.2 dB in the antenna sharer in the sixth exemplary embodiment, and 2.25 dB in the conventional antenna sharer. Attenuation at 923 MHz is 41 dB in the antenna sharer in this exemplary embodiment, and 32 dB in the conventional antenna sharer. Consequently, it can be confirmed, as described above, that the exemplary embodiment achieves both sharpness in crossband and low loss in the transmission passband.

(Seventh Exemplary Embodiment)

Figure 10:
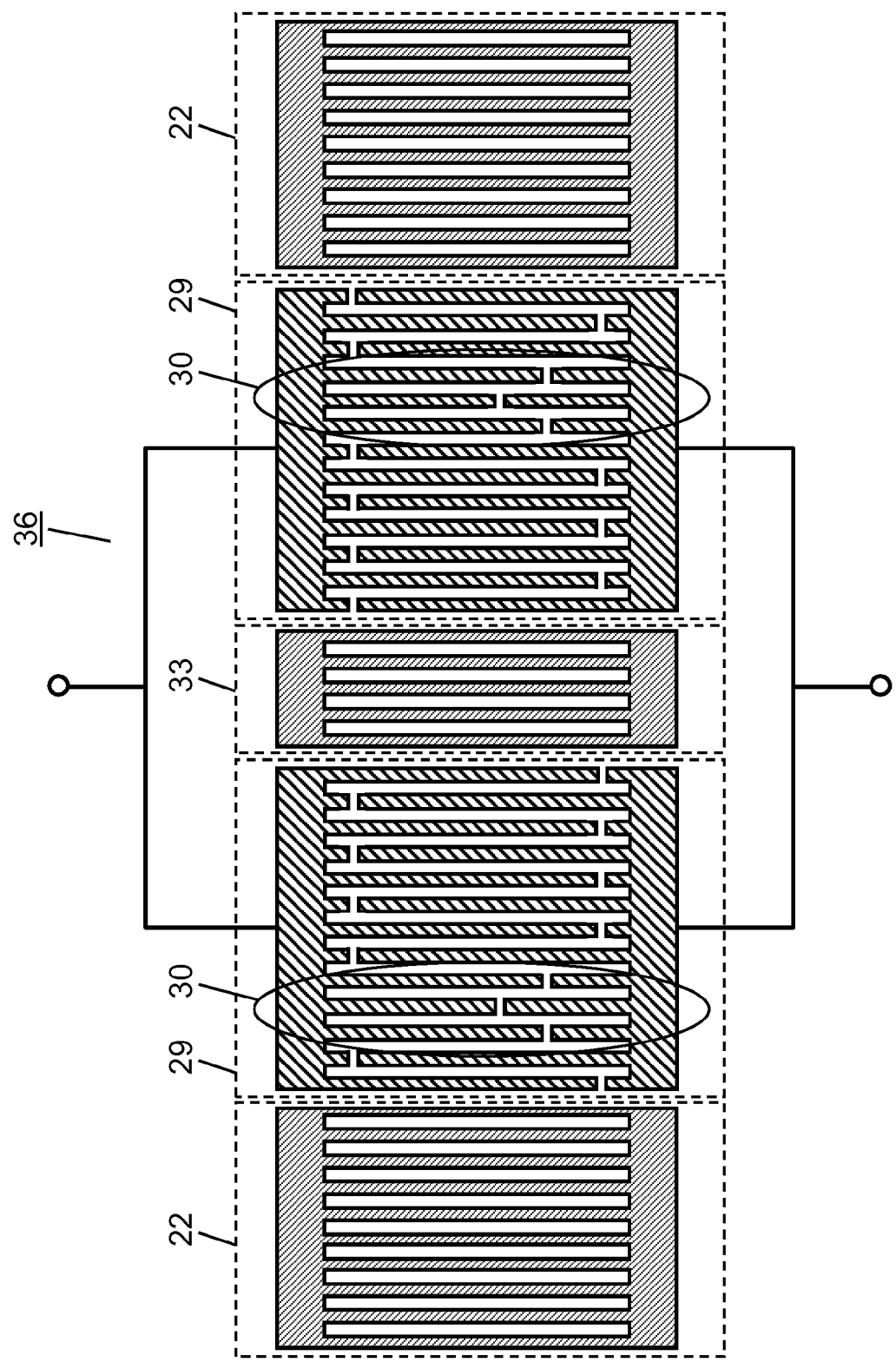

An antenna sharer in the seventh exemplary embodiment is described below with reference to drawings. FIG. 10 is resonator 36 with a means for reducing electromechanical coupling coefficient in the antenna sharer in the seventh exemplary embodiment. Unless particularly described, a configuration of the antenna sharer in the seventh exemplary embodiment is the same as that of the antenna sharers in other exemplary embodiments, and thus the same reference marks are given.

Resonator 36 has IDTs 29 with weight 30 in which a part of its crossover width is smaller than other part. IDTs 29 are connected in parallel to each other. Reflector 33 is also formed between these multiple IDTs 29.

Resonator 36 shown in FIG. 10 has 90 electrode fingers each for IDTs 29 connected in parallel, 25 electrode fingers each for three reflectors 22 and 33, and a crossover width of 160 μm for IDTs 29. This achieves the static capacitance equivalent to that of resonator 23 shown in FIG. 4. The electromechanical coupling coefficient can be made as small as 7.96%, and Q value is also about the same. This configuration efficiently achieves a resonator with small electromechanical coupling coefficient.

In first filter 3, both sharpness in crossband and low loss in the transmission passband are achieved by providing the aforementioned means for reducing electromechanical coefficient to a series resonator with relatively low antiresonant frequency, and not providing the aforementioned electromechanical coupling coefficient to a series resonator with relatively high antiresonant frequency.

Furthermore, the antenna sharer can further improve sharpness in crossband and also further reduce losses in the transmission passband by providing the means for reducing electromechanical coupling coefficient to first series resonator 6 with the lowest antiresonant frequency and not providing it to other series resonators and parallel resonators in first filter 3.

(Eighth Exemplary Embodiment)

Figure 11:
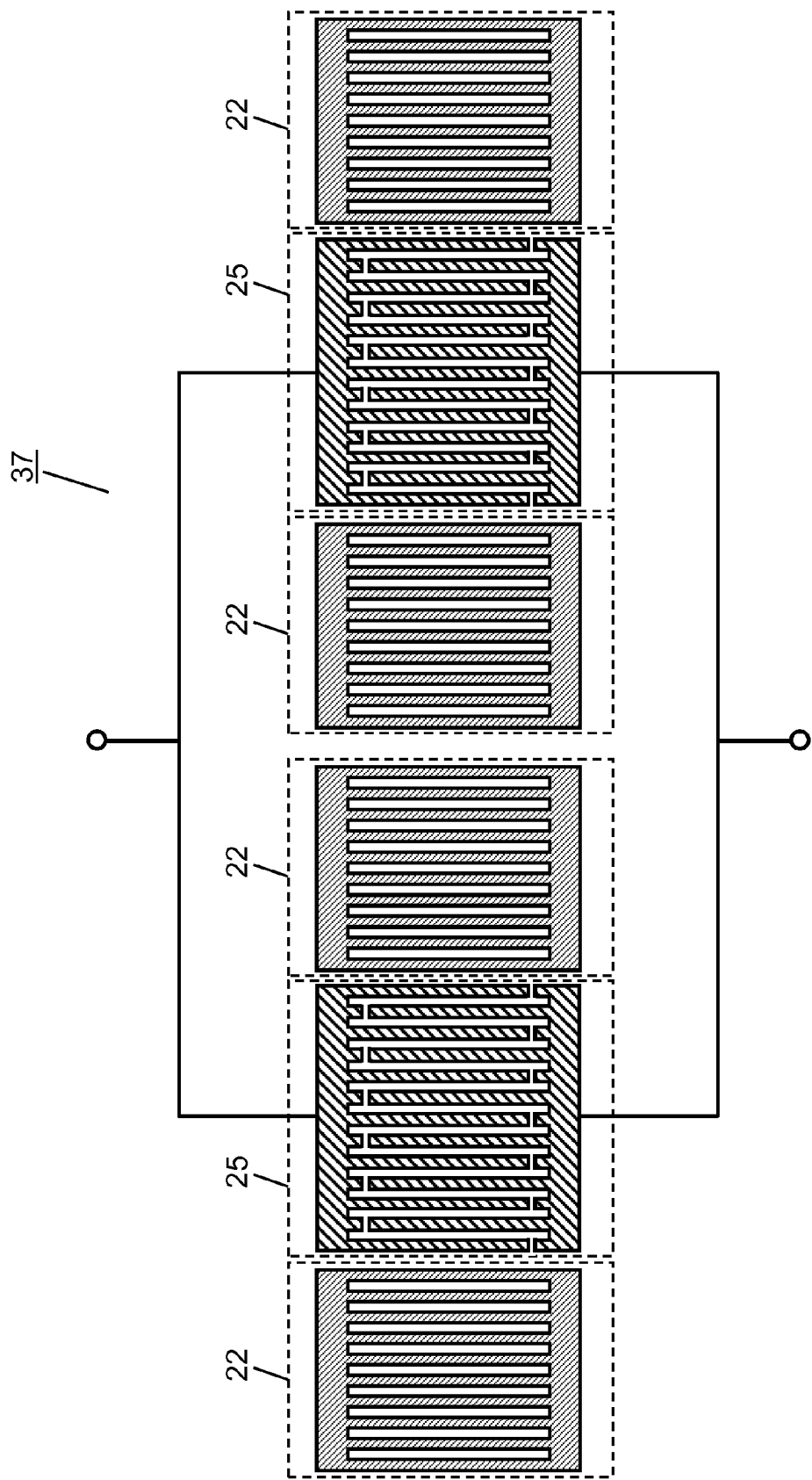
FIG. 11 illustrates a configuration of resonator to which a means for reducing electromechanical coupling coefficient is provided in the antenna sharer in accordance with a eighth exemplary embodiment of the present invention.

An antenna sharer in the eighth exemplary embodiment is described below with reference to drawings. FIG. 11 is resonator 37 with a means for reducing electromechanical coupling coefficient in the antenna sharer in the eighth exemplary embodiment. Unless particularly described, a configuration of the antenna sharer in the eighth exemplary embodiment is the same as that of the antenna sharers in other exemplary embodiments.

Resonator 37 is configured with multiple resonators connected in parallel to each other. Each resonator has IDT 25 of normal comb electrodes with substantially uniform crossover width, and reflector 33 formed at both ends of IDT 25. This configuration achieves a resonator with small electromechanical coupling coefficient.

In first filter 3, both sharpness in crossband and low loss in the transmission passband are achieved by providing the aforementioned means for reducing electromechanical coefficient to a series resonator with relatively low antiresonant frequency, and not providing the aforementioned means for reducing electromechanical coupling coefficient to a series resonator with relatively high antiresonant frequency.

Furthermore, the antenna sharer can further improve sharpness in crossband and also further reduce losses in the transmission passband by providing the aforementioned means for reducing electromechanical coupling coefficient to first series resonator 6 with the lowest antiresonant frequency and not providing it to other series resonators and parallel resonators in first filter 3.

The same effect is achievable by combining the configuration in the eighth exemplary embodiment with the methods described in other exemplary embodiments. For example, the same effect is achievable by combining with apodization-weighted IDT in which its crossover width reduces in a phased manner toward the ends in the first exemplary embodiment, the IDT with thinned-out weight shown in the second exemplary embodiment, or the IDT with weight in which a part of its crossover width is smaller than other part in the third exemplary embodiment.

(Ninth Exemplary Embodiment)

Figure 12:
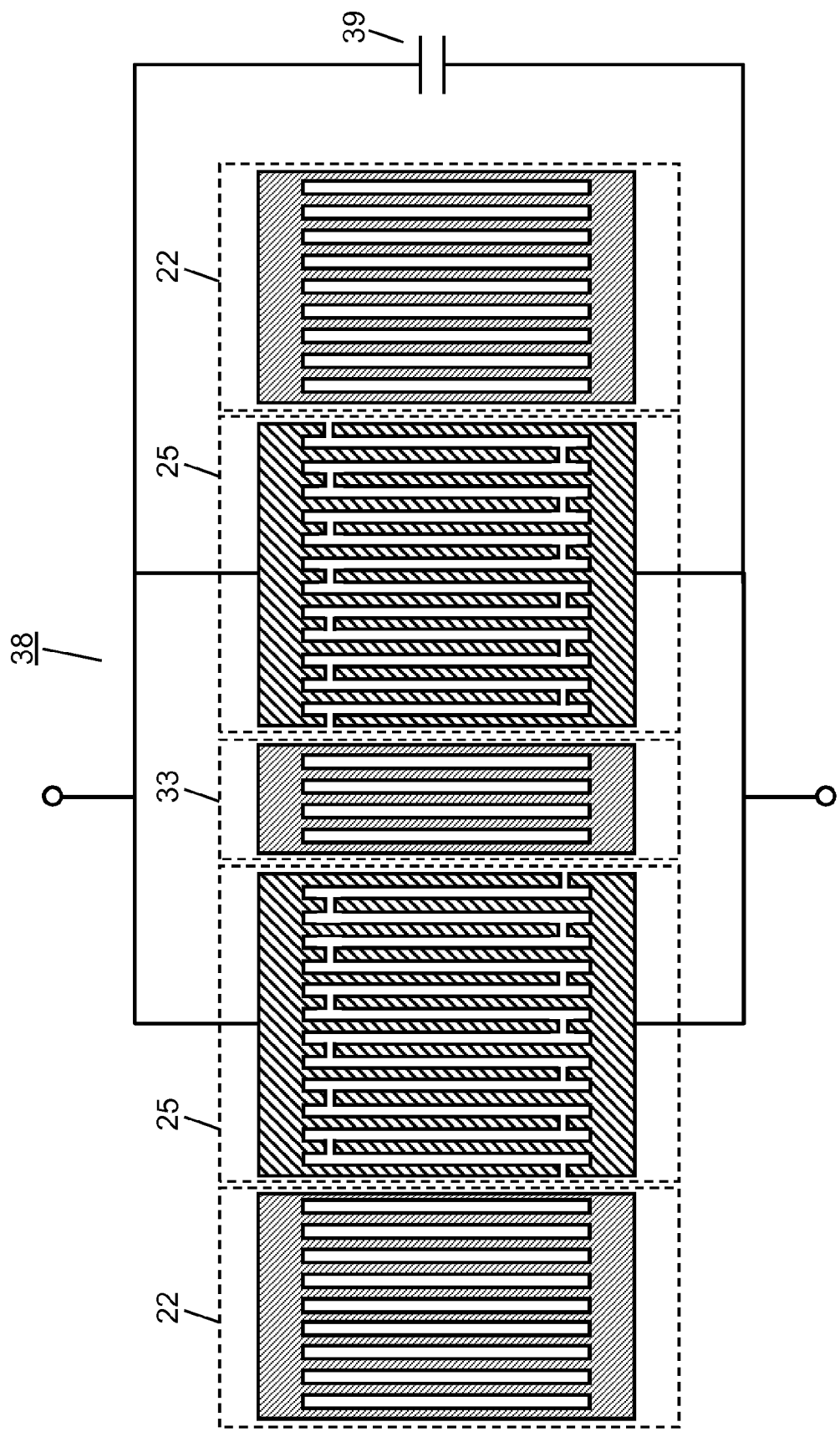
FIG. 12 illustrates a configuration of resonator to which a means for reducing electromechanical coupling coefficient is provided in the antenna sharer in accordance with a ninth exemplary embodiment of the present invention.

An antenna sharer in the ninth exemplary embodiment is described below with reference to drawings. FIG. 12 is resonator 38 with a means for reducing electromechanical coupling coefficient in the antenna sharer in the ninth exemplary embodiment. Unless particularly described, a configuration of the antenna sharer in the ninth exemplary embodiment is the same as that of the antenna sharer in other exemplary embodiments, and thus same reference marks are given.

Resonator 38 is configured with a resonator and capacitance 39 on a chip connected in parallel to each other. The resonator has IDTs 25 of normal comb electrodes connected in parallel to each other, and reflector 33 formed between these multiple IDTs 25. This configuration achieves a resonator with small electromechanical coupling coefficient.

In first filter 3, both sharpness in crossband and low loss in the transmission passband can be achieved by providing the aforementioned means for reducing electromechanical coefficient to a series resonator with relatively low antiresonant frequency, and not providing the aforementioned means for reducing electromechanical coupling coefficient to a series resonator with relatively high antiresonant frequency.

Furthermore, the antenna sharer can further improve the sharpness in crossband and further reduce losses in the transmission passband by providing the aforementioned means for reducing electromechanical coupling coefficient to first series resonator 6 with the lowest antiresonant frequency and not providing it to other series resonators and parallel resonators in first filter 3.

(Tenth Exemplary Embodiment)

An antenna sharer in the tenth exemplary embodiment is described below with reference to drawings. Unless particularly described, a configuration of the antenna sharer in the tenth exemplary embodiment is the same as that of the antenna sharers in other exemplary embodiments, and thus same reference marks are given.

Figure 13:
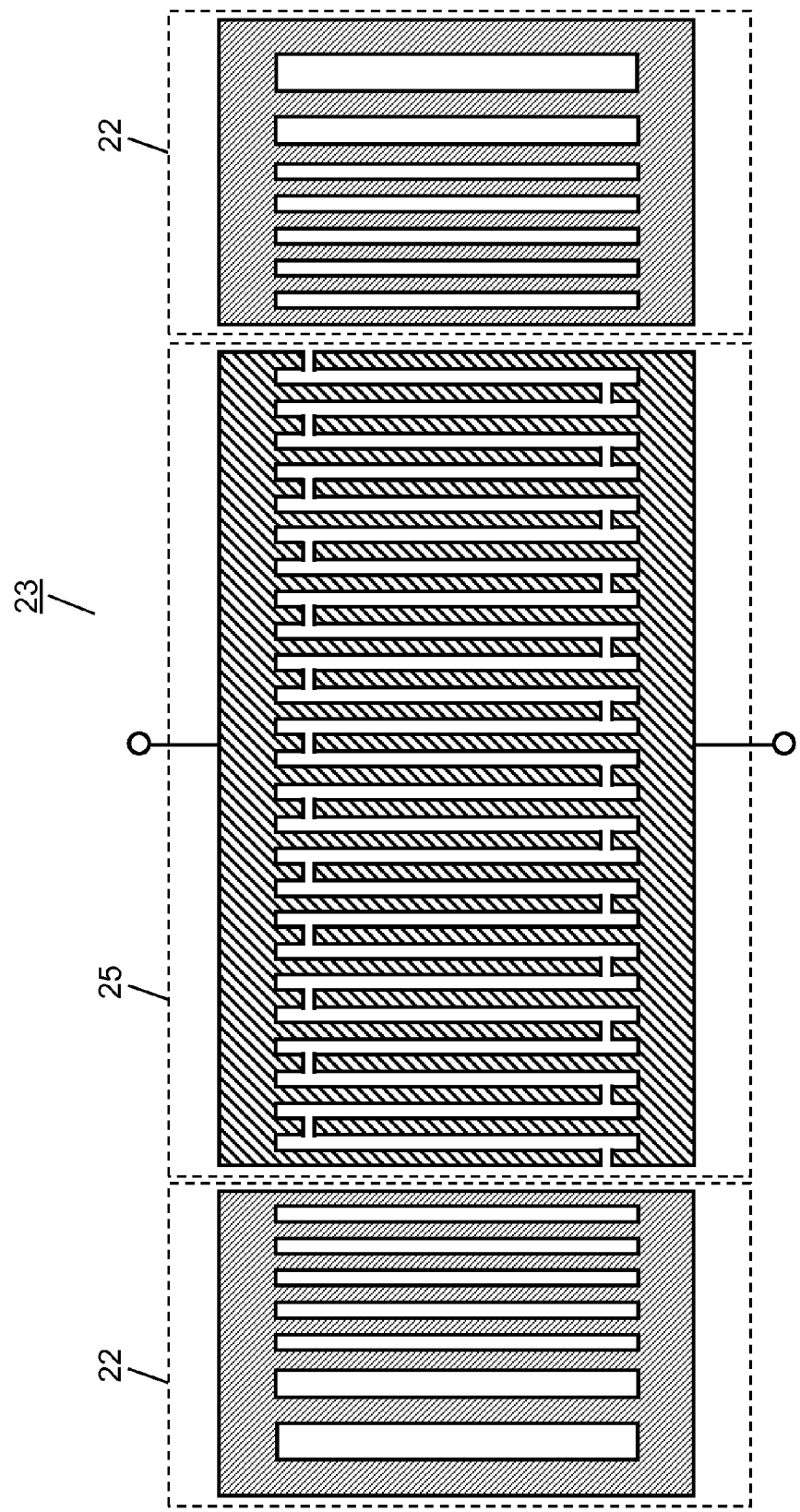
FIG. 13 illustrates a configuration of resonator to which a means for reducing electromechanical coupling coefficient is provided in the antenna sharer in accordance with a tenth exemplary embodiment of the present invention.

As shown in FIG. 13, in the antenna sharer in the tenth exemplary embodiment, first parallel resonator 11 with the lowest antiresonant frequency in multiple parallel resonators shown in aforementioned Table 1 has IDT and reflectors formed at both ends of this IDT. A pitch of at least a part of these reflectors is gradually broadened from the side near to the IDT to the far side. This first parallel resonator 11 is connected adjacent to series resonator 6.

This configuration increases Q value in antiresonant frequency, and this effect reduces an insertion loss at a high-frequency end of the transmission passband. Consequently, the antenna sharer can achieve both sharpness in crossband and low loss in the transmission passband.

Industrial Applicability

The antenna sharer of the present invention has an effect of achieving both sharpness in crossband and low loss in the transmission passband. This is applicable to electronic devices such as mobile phones.

The invention claimed is:

1. An antenna sharer comprising:
a first filter for passing a signal in a first frequency band; and
a second filter for passing a signal in a second frequency band higher than the first frequency band;
wherein
the first filter includes a ladder filter including a first series resonator and a second series resonator that has an antiresonant frequency higher than an antiresonant frequency of the first series resonator, and the first series resonator has an electromechanical coupling coefficient smaller than an electromechanical coupling coefficient of the second series resonator, and
the first series resonator has a thinned-out weighted IDT in which crossover of input and output electrode fingers is partially eliminated.

2. The antenna sharer of claim 1,
wherein
the first series resonator has a smallest antiresonant frequency among other series resonators of the first filter.

3. The antenna sharer of claim 1,
wherein
the first series resonator has a largest static capacitance among other series resonators of the first filter.

4. The antenna sharer of claim 1,
wherein
the first filter is a transmission filter, and
the first series resonator is a resonator nearest to an input terminal of the first filter among other series resonators of the first filter.

5. The antenna sharer of claim 4,
wherein
the first series resonator has a plurality of IDTs connected in parallel to each other, and
a reflector is formed between the plurality of IDTs.

6. The antenna sharer of claim 5,
wherein
a pair of reflectors are also formed at both ends of the plurality of IDTs.

7. The antenna sharer of claim 1,
wherein
the first series resonator has an apodization-weighted IDT in which a crossover width reduces in a phasedown manner from a center toward an end.

8. The antenna sharer of claim 1,
wherein
the first series resonator has a weighted IDT in which a part of crossover width is smaller than other parts.

9. The antenna sharer of claim 1,
wherein
the first series resonator has a plurality of IDTs connected in parallel to each other, and
a reflector is formed between the plurality of IDTs.

10. The antenna sharer of claim 9,
wherein
a pair of reflectors are also formed at both ends of the plurality of IDTs.

11. The antenna sharer of claim 1,
wherein
the first series resonator is configured with a plurality of resonators connected in parallel to each other, and each of the plurality of resonators includes a pair of reflectors provided at both ends of the IDT.

12. An antenna sharer comprising:
a first filter for passing a signal in a first frequency band; and
a second filter for passing a signal in a second frequency band higher than the first frequency band;
wherein
the first filter includes a ladder filter including a first series resonator and a second series resonator that has an antiresonant frequency higher than an antiresonant frequency of the first series resonator, and the first series resonator has an electromechanical coupling coefficient smaller than an electromechanical coupling coefficient of the second series resonator,
wherein
the first filter includes a plurality of parallel resonators,
a parallel resonator with a lowest antiresonant frequency in the plurality of parallel resonators has an IDT and a pair of reflectors formed at both ends of this IDT, and
a pitch of at least a part of area of the pair of reflectors is gradually broadened from a side near to the IDT to a side away from the IDT.

13. The antenna sharer of claim 12,
wherein
the parallel resonator is connected adjacently to the first series resonator.

* * * * *